United States Patent [19]
Desai et al.

[11] Patent Number: 6,166,434
[45] Date of Patent: *Dec. 26, 2000

[54] DIE CLIP ASSEMBLY FOR SEMICONDUCTOR PACKAGE

[75] Inventors: Kishor V. Desai, Livermore; Sunil A. Patel, Los Altos; John P. McCormick, Palo Alto, all of Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/935,583

[22] Filed: Sep. 23, 1997

[51] Int. Cl.⁷ .................................................. H01L 23/12
[52] U.S. Cl. ...................... 257/704; 257/706; 257/707; 257/778
[58] Field of Search .................................. 257/706, 707, 257/778, 704

[56] References Cited

U.S. PATENT DOCUMENTS

| | | | |
|---|---|---|---|
| 3,449,640 | 6/1969 | Franklin | 257/707 |
| 4,004,195 | 1/1977 | Harayda et al. . | |
| 4,069,498 | 1/1978 | Joshi | 257/707 |
| 4,323,914 | 4/1982 | Berndlmaier et al. | 257/778 |
| 4,845,545 | 7/1989 | Abramowitz et al. | 257/704 |
| 5,006,922 | 4/1991 | Meshane et al. . | |
| 5,019,673 | 5/1991 | Juskey et al. . | |
| 5,103,292 | 4/1992 | Mahulikar . | |
| 5,291,064 | 3/1994 | Kurokawa . | |
| 5,311,059 | 5/1994 | Banerji et al. | 257/778 |
| 5,371,404 | 12/1994 | Juskey et al. . | |
| 5,409,865 | 4/1995 | Karnezos . | |
| 5,525,835 | 6/1996 | Culrane et al. . | |
| 5,561,323 | 10/1996 | Andros et al. | 257/707 |
| 5,570,272 | 10/1996 | Variot . | |
| 5,572,070 | 11/1996 | Ross | 257/713 |
| 5,631,497 | 5/1997 | Miyano et al. | 257/668 |
| 5,721,451 | 2/1998 | Settles et al. | 257/679 |
| 5,737,191 | 4/1998 | Horiuchi et al. . | |
| 5,789,809 | 8/1998 | Joshi | 257/704 |
| 5,850,104 | 12/1998 | Avis | 257/726 |

FOREIGN PATENT DOCUMENTS

| | | | |
|---|---|---|---|
| 57-21845 | 2/1982 | Japan | 257/704 |
| 61-248451 | 11/1986 | Japan . | |
| 2-28351 | 1/1990 | Japan . | |
| 3-82144 | 4/1990 | Japan . | |
| 3-236249 | 10/1991 | Japan . | |

*Primary Examiner*—Roy Potter

[57] ABSTRACT

Provided is a die clip for use in semiconductor flip chip packaging as a replacement for the conventional combination of a heat spreader and stiffener, a packaging method using the die clip, and a semiconductor package incorporating the die clip. In a preferred embodiment, the die clip is a piece of high modulus, high thermal conductivity material shaped to attach over a die on the surface of a packaging substrate. The die clip closely engages the die while leaving some space open around the perimeter to provide access to the die. An underfill material may then be dispensed into the gap between the die and the substrate through an opening in the die clip. The underfill material is then cured, the die clip providing a heat sink and keeping the die and substrate flat and immobile during and after the curing process. A BGA process may then be used to apply solder balls to the underside of the substrate for subsequent bonding of the package to a circuit board for use.

13 Claims, 3 Drawing Sheets

FIG._1A
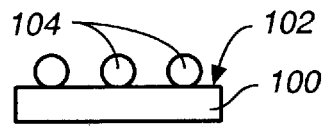
FIG._1B
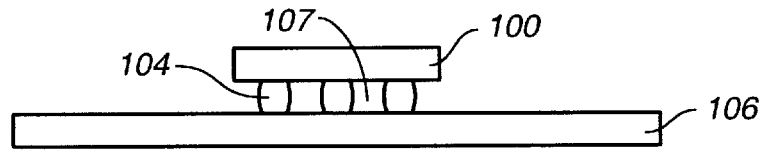
FIG._1C
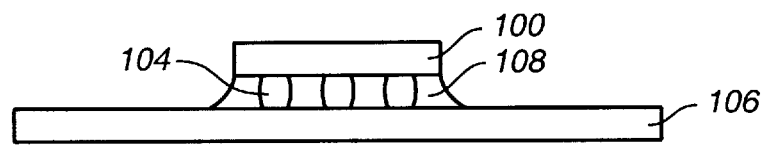
FIG._1D
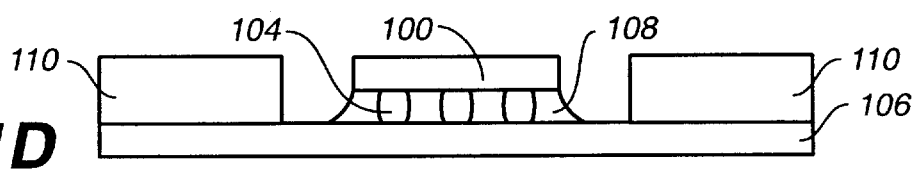
FIG._1E
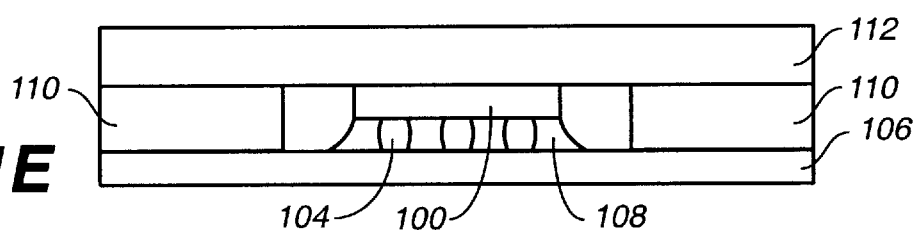
FIG._1F
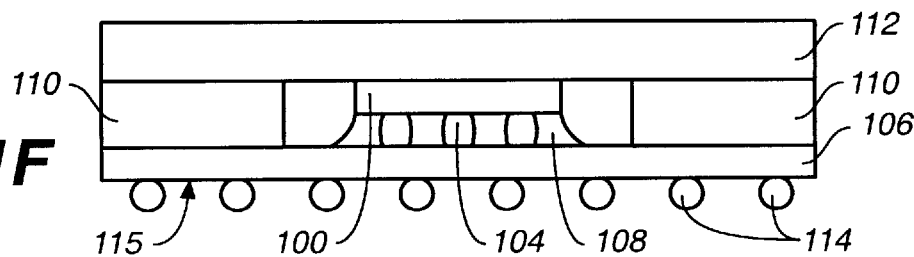

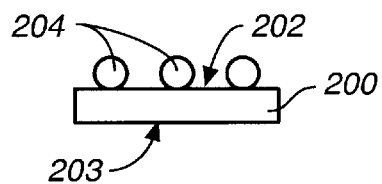
FIG._2A
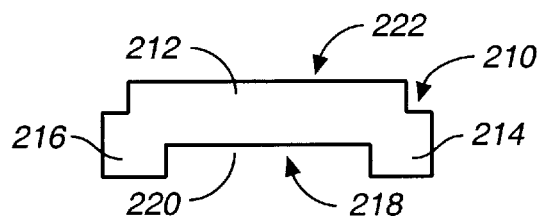
FIG._2B
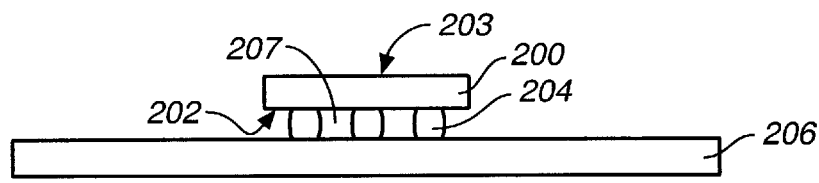
FIG._2C
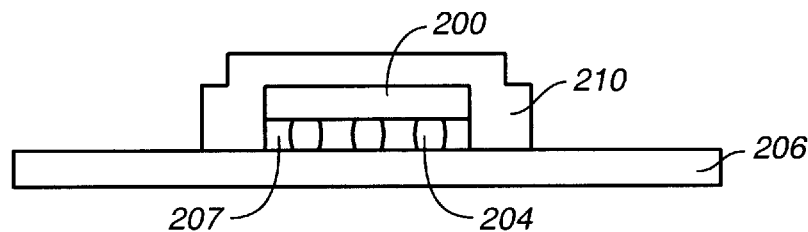
FIG._2D
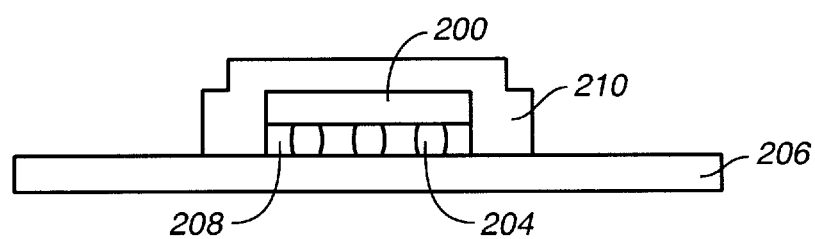
FIG._2E
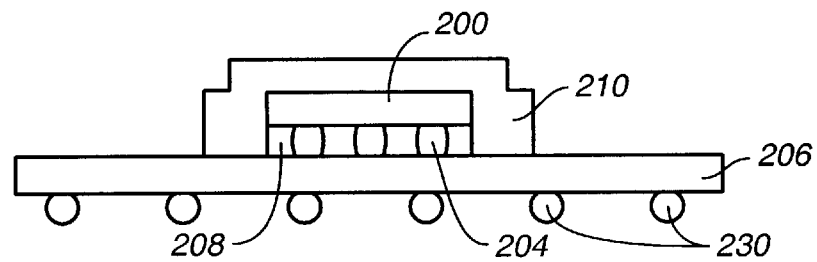
FIG._2F

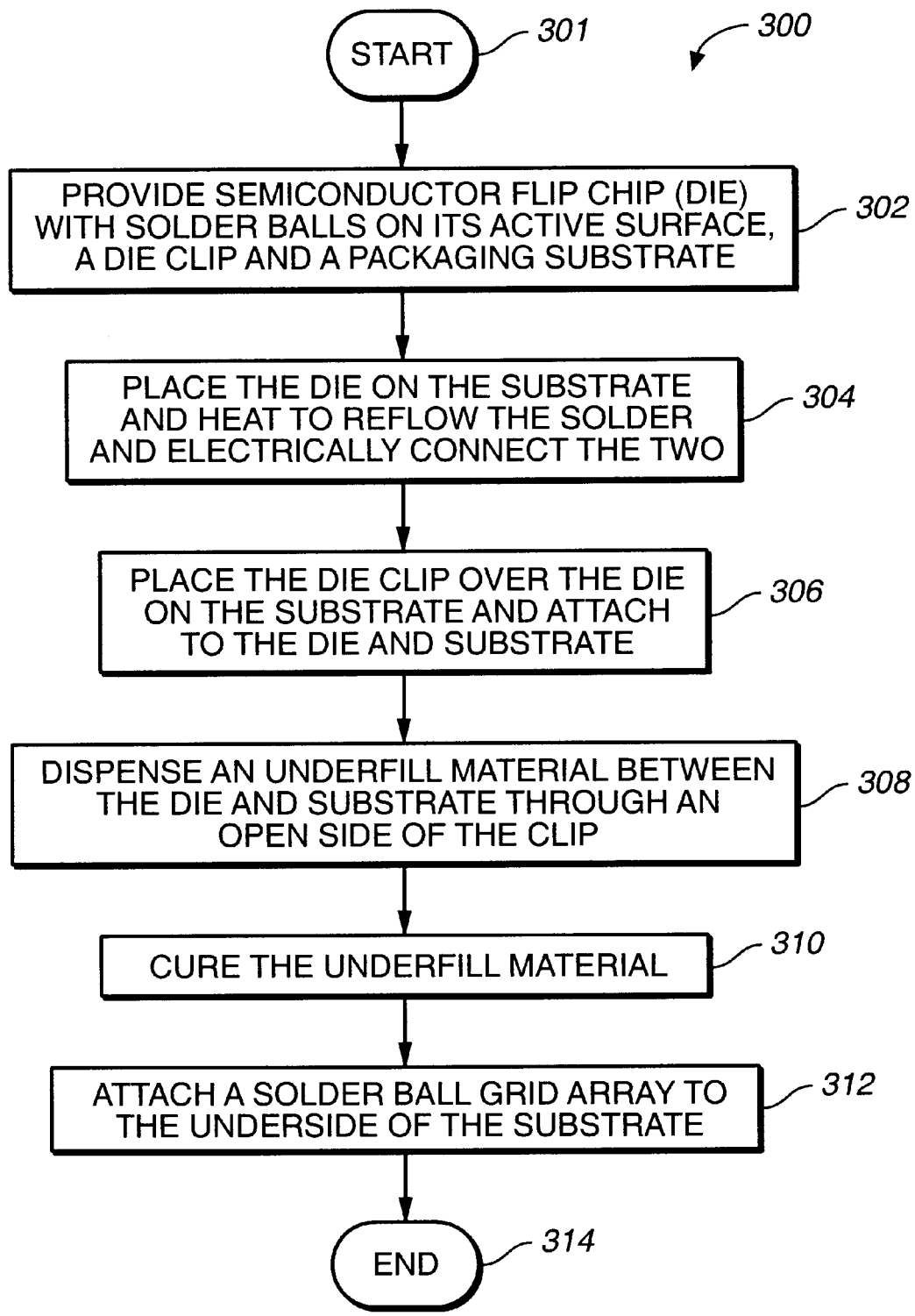
FIG._3

DIE CLIP ASSEMBLY FOR SEMICONDUCTOR PACKAGE

BACKGROUND OF THE INVENTION

This invention relates generally to semiconductor chip device assembly, and in particular to flip chip device assembly. More specifically, the invention relates to a die clip and method of assembly which reduces stress and warpage of a semiconductor die during and after attachment of the die to a substrate.

In semiconductor device assembly, a semiconductor chip (also referred to as an integrated circuit (IC) chip or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips".

FIGS. 1A–F illustrate stages in a conventional method for packaging a semiconductor flip chip, in which a semiconductor die and a packaging substrate are electrically connected and mechanically bonded. FIG. 1A shows a cross-sectional, side view of an unbonded flip chip with the chip 100 having an active circuit surface 102 on which are arranged solder balls 104. The solder may be composed of a low melting point eutectic material or a high lead material, for example. It should be noted that this figure and the figures that follow are intended to be representative and, for example, do not show the solder balls 104 in proportion to the semiconductor die 100. In current designs, the die may have dimensions on the order of 0.5×0.5 inch (1 inch=2.54 cm) whereas the unbonded solder balls may have a diameter on the order of 4 to 5 mils (1 mil=$10^{-3}$ inch=0.0254 mm).

Prior to bonding the die 100 to a substrate, solder flux is applied to either the active surface 102 of the die 100 or the packaging substrate surface. The flux serves primarily to aid the flow of the solder, such that the solder balls 104 make good contact with traces on the packaging substrate. It may be applied in any of a variety of methods, including brushing or spraying, or dipping the die 100 into a thin film, thereby coating the solder balls 104 with flux. The flux generally has an acidic component, which removes oxide barriers from the solder surfaces, and an adhesive quality, which helps to prevent the die from moving on the packaging substrate surface during the assembly process.

As shown in FIG. 1B, after the flux is applied, the die 100 is aligned with and placed onto a placement site on the packaging substrate 106 such that the die's solder balls 104 are aligned with electrical traces (not shown) on the substrate 106. The substrate is typically composed of a laminate or organic material, such as fiber glass, PTFE (such as Teflon™, available form Gore, Eau Claire, Wis.) BT resin, epoxy laminates or ceramic-plastic composites. Heat (to a temperature of about 220° C., for example) is applied to one or more of the die 100 and the packaging substrate 106, causing the solder balls 104 to reflow and form electrical connections between the die 100 and the packaging substrate 106. Then, the remaining flux residue is substantially removed in a cleaning step, for instance by washing with an appropriate solvent.

At this point, the mechanical bonding procedure can begin. An underfill material, typically a thermo-set epoxy 108, such as is available from Hysol Corporation of Industry, California (product numbers 4511 and 4527), Ablestik Laboratories of Rancho Domingo, Calif., and Johnson Matthey Electronics of San Diego, Calif., is dispensed into the remaining space (or "gap") 107 between the die 100 and the substrate 106. In a typical procedure, a bead of thermo-set epoxy, is applied along one edge of the die where it is drawn under the die by capillary action until it completely fills the gap between the die and the packaging substrate. Slight heating of the packaging substrate after dispensing of the underfill epoxy assists the flow. In some cases, the underfill epoxy flow is further assisted by vacuum, or, alternatively, by injection of the epoxy into the gap.

After the epoxy 108 has bled through the gap 107, a separate bead of epoxy (not shown) may also be dispensed and bonded around the perimeter of the die 100. Thereafter, the epoxy (both the underfill and perimeter bonding epoxy, if any) are cured by heating the substrate and die to an appropriate curing temperature, for example, about 130 to 165° C. In this manner the process produces a mechanically, as well as electrically, bonded semiconductor chip assembly, with the underfill material 108 allowing a redistribution of the stress at the connection between the die 100 and the substrate 106 from the solder 104 joints only to the entire sub-die area. FIG. 1C shows the semiconductor die 100 interconnected to the packaging substrate 106 electrically by solder 104 joints and mechanically by a cured layer of epoxy 108.

Semiconductor packages are typically subject to temperature cycling during normal operation. In order to improve the thermal performance and reliability of the packages, a stiffener 110 may be placed around the die 100 on the substrate 106 where it is bonded with a heat curable adhesive (not shown), as shown in FIG. 1D. The stiffener 110 is typically a flat piece of high modulus (about $9 \times 10^6$ to $30 \times 10^6$ psi) metal about 10 to 40 mils thick, having substantially the same dimensions as the package substrate 106 with a window 111 in its center to clear the die 100. Typically, the stiffener 110 is composed of nickel-plated copper which has a coefficient of thermal expansion similar to that of typical substrate 106 materials. The stiffener 110 may be bonded to the substrate 106 prior to the placement, bonding and underfilling/curing steps previously described, or it may be bonded after the placement and bonding of the die 100, but prior to the underfilling/curing step. The stiffener is typically bonded and cured in a separate step following curing of the underfill material 108. The adhesive may also be cured concurrently with the curing of the underfill material in a single heating step.

The purpose of the stiffener 110 is to constrain the substrate 106 in order to prevent its warpage or other movement relative to the die 100 which may be caused by thermal cycling during operation of an electronic device in which the package is installed. Such movement may result from the different coefficients of thermal expansion (CTE) of the die 100 and substrate 106 materials, and may produce stress in the die or the package as a whole which can result in electrical and mechanical failures.

Next, as shown in FIG. 1E, a heat spreader 112, typically composed of a high thermal conductivity (about 2 to 4 W/cm·K) material, and having substantially the same dimensions as the package substrate 106, is attached over the stiffener 110 and the die 100 and bonded to each by a thermally conductive adhesive (not shown) which is also then heat cured. A conventional heat spreader is also typically a flat piece of nickel-plated copper about 20 to 40 mils thick. A conventional heat spreader 112 may not be applied until the underfill material 108 has been dispensed and cured because the heat spreader 112 prevents access to the die 100. Therefore, the heat spreader 112 is applied in a separate step following attachment of the die 100 and stiffener 110.

The purpose of the heat spreader is to disperse the heat generated during thermal cycling in order to reduce stress in the package due to different CTEs of the various elements of the package, including the die 100, substrate 106 and underfill 108. Since it covers and is attached to the die 100, the heat spreader 112 also plays a role is constraining the die 100 in place on the substrate 106, but only once the heat spreader 112 is attached in position following dispensation and curing of the underfill material 108.

In a final step of a conventional packaging process, shown in FIG. 1F, solder balls 116 are bonded to the underside 115 of the substrate 106. These solder balls 116 may be used to bond the chip package to a circuit board, such as a mother board, for use in an electronic application.

A problem with such flip chip package constructions is that during the heating and cooling involved in curing of the underfill material 108, the different CTEs of the substrate 106 and die 100 materials may stress these materials by causing them to warp or otherwise move relative to each other. In addition, the epoxy underfill 108 typically shrinks during the curing process, applying additional stress on the bonded die 100 and substrate 106 which may cause one or both to warp. As discussed above with reference to operational thermal cycling, such stress in the semiconductor package which may ultimately result in its electronic and/or mechanical failure, including cracking of the die 100. Moreover, the use of separate stiffener 110 and heat spreader 112 elements adds two bonding steps to the basic flip-chip packaging process, thereby decreasing production efficiency.

Accordingly, what is needed are methods and apparatuses for improving the reliability of flip-chip packages by providing die constraint during the underfill curing process, and packaging processes which minimize steps to maximize efficiency.

SUMMARY OF THE INVENTION

To achieve the foregoing, the present invention provides a die clip for use in semiconductor flip chip packaging as a replacement for the conventional combination of a heat spreader and stiffener, a packaging method using the die clip, and a semiconductor package incorporating the die clip. In a preferred embodiment, the die clip is a piece of high modulus (preferably about $9 \times 10^6$ to $30 \times 10^6$ psi; more preferably about $15 \times 10^6$ to $30 \times 10^6$ psi, and most preferably about $25 \times 10^6$ psi), high thermal conductivity (preferably about 2 to 4 W/cm·K; more preferably about 3 to 4 W/cm·K, and most preferably about 4 W/cm·K) material shaped to attach over a die on the surface of a packaging substrate. The die clip closely engages the die while leaving some space open around the perimeter to provide access to the die. An underfill material may then be dispensed into the gap between the die and the substrate through an opening in the die clip. The underfill material is then cured, the die clip providing a heat sink and keeping the die and substrate flat and immobile during and after the curing process. A BGA process may then be used to apply solder balls to the underside of the substrate for subsequent bonding of the package to a circuit board for use.

In a preferred embodiment, the present invention provides a die clip for securing a semiconductor die to a packaging substrate. The die clip includes a top portion and a circumferential side region attached to the top portion. The top portion and the circumferential side region define a cavity which is capable of covering and partially enclosing a semiconductor die mounted on a packaging substrate. The die clip is capable of attaching to the die and to the packaging substrate to hold the die substantially in place on the substrate, and substantially prevent warpage of the die relative to the substrate. The die clip is preferably composed of a high modulus, high thermal conductivity material shaped into the top portion and circumferential side region, so that the top portion and circumferential side region together form a unitary structure which defines the cavity.

In another embodiment, the present invention also provides a semiconductor package. The package includes a packaging substrate having a top side and an underside and a semiconductor die having an active surface and a top surface. The active surface of the die is bonded to the top side of the substrate, and an underfill material is between the die and the substrate. The package also includes a die clip bonded to the top surface of the die and to the top side of the substrate, the die clip. The die clip has a top portion and a circumferential side region attached to the top portion. The top portion and the circumferential side region define a cavity which is covers and partially encloses the semiconductor die mounted on the packaging substrate. The die clip is attached to the die and to the packaging substrate to hold the die substantially in place on the substrate, and substantially prevent warpage of the die relative to the substrate. The die clip is preferably composed of a high modulus material shaped into the top portion and circumferential side region, so that the top portion and circumferential side region together form a unitary structure which defines the cavity. A semiconductor package according to this preferred embodiment of the present invention may also include a solder ball grid array attached to the underside of the substrate.

In another aspect, the present invention provides a method of making a semiconductor flip chip package. The method involves providing a packaging substrate having a top side and an underside, electrically bonding a semiconductor die to electrical traces on the top side of the substrate, and bonding a die clip to the top side of the substrate and to a top surface of the die. The die clip has a top portion and a circumferential side region attached to the top portion. The top portion and the circumferential side region define a cavity which is covers and partially encloses the semiconductor die mounted on the packaging substrate. The die clip is attached to the die and to the packaging substrate to hold the die substantially in place on the substrate, and substantially prevent warpage of the die relative to the substrate. Once the die clip is attached, an underfill material is dispensed between the die and the substrate through an opening in the circumferential side region of the die clip. The underfill material is then cured. The die clip is preferably composed of a high modulus material shaped into the top portion and circumferential side region, so that the top portion and circumferential side region together form a unitary structure which defines the cavity. A method according to this preferred embodiment of the present invention may also involve attaching a solder ball grid array to the underside of the substrate.

These and other features and advantages of the present invention are described below with reference to the drawings.

BRIEF DESCRIPTION OF THE DRAWINGS

FIGS. 1A–F depict cross-sectional views of stages in the packaging of flip chip devices using a conventional stiffener and heat spreader.

FIGS. 2A–F depict cross-sectional views of stages in the packaging of flip chip devices using a die clip in accordance with a preferred embodiment of the present invention.

FIG. 3 depicts a flow chart showing the steps of a method of packaging of flip chip devices using a die clip in accordance with a preferred embodiment of the present invention.

DETAILED DESCRIPTION OF THE PREFERRED EMBODIMENTS

The present invention provides a die clip for use in semiconductor flip chip packaging as a replacement for the conventional combination of a heat spreader and stiffener, a packaging method using the die clip, and a semiconductor package incorporating the die clip. In a preferred embodiment, the die clip is a piece of high modulus, high thermal conductivity material shaped to attach over a die on the surface of a packaging substrate. The die clip closely engages the die while leaving some space open around the perimeter to provide access to the die. An underfill material may then be dispensed into the gap between the die and the substrate through an opening in the die clip. The underfill material is then cured, the die clip providing a heat sink and keeping the die and substrate flat and immobile during and after the curing process. A BGA process may then be used to apply solder balls to the underside of the substrate for subsequent bonding of the package to a circuit board for use.

In the following description, numerous specific details are set forth in order to fully illustrate preferred embodiments of the present invention. It will be apparent, however, that the present invention may be practiced without limitation to some specific details presented herein. For example, the die clip may take may different forms beyond those specifically depicted and described herein, which firmly hold the die to the substrate while providing access to the die perimeter through at least one side of the clip during underfill dispensation and cure.

FIG. 2A shows a cross-sectional view of a semiconductor die (flip chip) 200 with solder balls 204 attached to its active surface 202. The die 200 and solder balls 204 may be of the conventional sort well known to those of skill in the art, and described above.

FIG. 2B shows a cross-sectional view of a die clip in accordance with a preferred embodiment of the present invention. The die clip 210 may be composed of any substantially rigid, thermally conductive material compatible with the manufacture and operation of semiconductor packaging. In a preferred embodiment, the die clip 210 is composed of a high modulus (preferably about $9 \times 10^6$ to $30 \times 10^6$ psi; more preferably about $15 \times 10^6$ to $30 \times 10^6$ psi, and most preferably about $25 \times 10^6$ psi), high thermal conductivity (preferably about 2 to 4 W/cm·K; more preferably about 3 to 4 W/cm·K, and most preferably about 4 W/cm·K) material which provides the benefits of the rigidity and the heat dissipation characteristics of conventional stiffeners and heat spreaders, respectively. In a preferred embodiment, the die clip 210 is composed of a high modulus, high conductivity metal. A particularly preferred material is nickel-plated copper.

In the preferred embodiment depicted in FIG. 2B, the die clip 210 has a top 212 and two sides 214 and 216 which surround a cavity 218 designed to accommodate the die 200. When the clip 210 is placed over the die 200, the two sides 214 and 216 of the clip 210 closely engage two edges of the die 200. On its two other sides 220 and 222 the clip 210 is open to provide access to the die 200 even when it is engaged (clipped) by the clip 210. The cavity 218 of the clip 210 has a depth sufficient to accommodate the height of the die 200 when bonded to the substrate 206. For example, for a typical 225 mm² die, the cavity may preferably be about 15.5 to 20 mm long, by about 15.5 to 20 mm wide, by about 0.4 to 0.6 mm deep, more preferably about 16 mm long, by about 16 mm wide, by about 0.5 mm deep.

It should be understood that the clip 210 may take a variety of forms as long as there remains at least some open space around its circumference to access the die 200 from the side. For example, the clip 210 may have three closed sides and one open side, the clip 210 may have a portion of one or more sides open, or the clip 210 may have a portion of a circular or other wise curved circumference open to provide access to a clipped die 200.

In FIG. 2C, the die 200 is shown bonded to a packaging substrate 206. This bonding, may be accomplished in a conventional manner and using conventional materials, as described above. For example, prior to bonding the die 200 to the substrate 230 solder flux (not shown) may be applied to either the active surface 204 of the die 200 or the packaging substrate 206 surface. The flux may be applied in any of a variety of methods, including brushing or spraying, or dipping the die 200 into a thin film, thereby coating the solder balls 204 with flux. After the flux is applied, the die 200 may be aligned with and placed onto a placement site on the packaging substrate 206 such that the die solder balls 204 are aligned with electrical traces (not shown) on the substrate 206. The substrate may be composed of a laminate or organic material, such as fiber glass, PTFE (such as Teflon™, available form Gore, Eau Claire, Wis.) BT resin, epoxy laminates or ceramic-plastic composites. Heat (to a temperature of about 220° C., for example) may be applied to one or more of the die 200 and the packaging substrate 206, causing the solder balls 204 to reflow and form electrical connections between the die 200 and electrical traces (not shown) on the packaging substrate 206. Then, the remaining flux residue is substantially removed in a cleaning step, for instance by washing with an appropriate solvent.

Once the die 200 is bonded (electrically connected) to the substrate 206, a die clip 210 according a preferred embodiment of the present invention is placed over the die 200 and attached to the top surface 203 of the die 200 and the substrate 206 surface, as shown in FIG. 2D. The attachment is preferably accomplished with a thermally conductive thermal adhesive. Such adhesives are well known to those skilled in the art. Alternatively or additionally, mechanical attachment means may be used to attach the clip 210. In a preferred embodiment, the adhesive may be applied the to the top 212 of the clip within the cavity 218 and the bottom of the clip sides 214 and 216 which contact the substrate 206. The adhesive may additionally or alternatively be applied to the top surface 203 of the die 200 and the substrate 206 surface at the point where the clip 210 contacts the substrate 206. Moreover, the adhesive used to attach the clip 210 to the die 200, and that used to attach the clip 210 to the substrate 206 may be the same or different adhesives. In a preferred embodiment, the adhesive is cured by heating, for example to a temperature of about 100 to 150° C., once the clip 210 is in position.

With the die 200 electrically bonded and firmly held in place on the substrate 206 by the clip 210, an underfill material 208, such as a thermo-set epoxy, for example, those available from Hysol Corporation of Industry, Calif. (product numbers 4511 and 4527), Ablestik Laboratories of Rancho Domingo, Calif., and Johnson Matthey Electronics of San Diego, Calif., is dispensed through an opening or openings on one or more sides of the clip 210 into the remaining space (or "gap") 207 between the die 200 and the substrate 206. In a preferred embodiment, a bead of thermo-set epoxy, is applied along one or more edges of the die 200 where it is drawn under the die 200 by capillary action until it completely fills the gap 207 between the die 200 and the packaging substrate 206. Slight heating of the packaging substrate after dispensing of the underfill epoxy may be used to assist the flow. In some cases, the underfill epoxy flow may be further assisted by vacuum, or, alternatively, by injection of the epoxy into the gap.

As shown in FIG. 2E, after the underfill epoxy 208 has been dispensed into the gap 207 it may be cured by heating the substrate 206 and/or die 200 to an appropriate curing temperature, for example, about 100 to 165° C. In this manner, the mechanical bonding of the die 200 to the substrate by dispensing and curing of the underfill material 208 occurs with the die 200 firmly held in place on the substrate 206 by the die clip 210. As such, the die is prevented from warping or otherwise moving during the curing step, as well as thereafter during operation in its intended application.

Since the die clip of the present invention is a single piece which replaces the conventional use of a separate stiffener and heat spreader, it provides the additional advantage of eliminating the need for two separate attachment steps, such as are used to attach the conventional apparatuses. As a result, the efficiency of the packaging process is improved.

In a preferred embodiment, the package may further be prepared for subsequent attachment to a circuit board by attaching a solder ball grid array (BGA) 230 to the underside of the packaging substrate 206, as in conventional packaging procedures, as shown in FIG. 2F.

FIG. 3 shows a flow chart 300 of a preferred method of packaging a semiconductor flip chip, in accordance with a preferred embodiment of the present invention. The method 300 begins at 301, and at a step 302 a semiconductor flip chip (die) with solder balls on its active surface, a packaging substrate and a die clip in accordance with the present invention are provided. At a step 304, the die is placed on the substrate, the die and or the substrate having first been coated with flux, as described above, and the substrate and/or die is heated to reflow the solder balls and electrically connect the die to appropriate electrical traces on the substrate.

Then, at a step 306, a die clip in accordance with the present invention is placed over the die and attached to the die and the substrate. Preferably, the die clip is attached using a thermal adhesive. Once the clip is attached over the die and firmly holding it in place on the substrate, an underfill material, such as a thermo-set epoxy, is dispensed through a side opening in the die clip and into the gap between the die and the substrate, at a step 308. The underfill material is cured at a step 310 by heating the substrate and/or die to an appropriate curing temperature, which may be about 100 to 165 ° C. for a typical epoxy underfill. The presence of the die clip prevents warping or other movement of the die relative to the substrate during and following curing of the underfill material. This decreases the likelihood of package failure resulting from underfill curing, and thus enhances the reliability of the package.

In a preferred embodiment, the package may be prepared for subsequent attachment to a circuit board by attaching a solder ball grid array to the underside of the packaging substrate at a step 312. The process is completed at 314.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A semiconductor package, comprising:
   a packaging substrate having a top side and an underside;
   a semiconductor die having an active surface and a top surface, said active surface of said die facing the top side of said substrate and bonded to the top side of said substrate;
   an underfill material substantially disposed between said die and said substrate; and
   a die clip bonded to said top surface of said die, said die clip comprising,
      a top portion;
      a bottom surface parallel to the active surface of the die, the bottom surface attached to the top side of said substrate;
      a side region attached to said top portion; and
      a cavity defined by said top portion and said side region, the top of said cavity covering and the side region of said cavity only partially enclosing the die mounted on said packaging substrate;
   wherein said die clip is attached to the die such that opposing portions of the side region of the die clip apply a force to the die to prevent lateral movement of the die; and
   wherein said die clip is comprised of a material having a modulus of elasticity between about $9 \times 10^6$ and $30 \times 10^6$ psi and a thermal conductivity between about 2 and 4 W/cm·K shaped into said top portion and side region, wherein the top portion and circumferential side region together form a unitary structure which defines said cavity.

2. The semiconductor package of claim 1, further comprising a solder ball grid array attached to the underside of said substrate.

3. The semiconductor package of claim 1, wherein said die clip is bonded to top surface of said die and to the top side of said substrate by a thermally conductive thermal adhesive.

4. The semiconductor package of claim 1, wherein said underfill material comprises a thermo-set epoxy.

5. The semiconductor package of claim 1, wherein said material comprises nickel-plated copper.

6. The semiconductor package of claim 5, wherein said nickel-plated copper is about 10 to 50 mils thick.

7. The semiconductor package of claim 1, wherein said top portion is substantially square in shape.

8. The semiconductor package of claim 7, wherein said side region two opposing sides of said clip attached to said top portion, two other opposing sides being open, wherein the top portion and the sides together form the unitary structure which defines said cavity.

9. The semiconductor package of claim 7, wherein said side region comprises three sides of said clip attached to said top portion, with the remaining side being open, wherein the top portion and the sides together form the unitary structure which defines said cavity.

10. The semiconductor package of claim 7, wherein said cavity is formed by four sides of said clip attached to said top portion, and wherein at least one of said four sides has an opening therein, wherein the top portion and the four sides together form the unitary structure which defines said cavity.

11. The semiconductor package of claim 1, wherein said top portion is substantially circular in shape.

12. The die clip of claim 1 wherein the opposing portions of the side region of the die clip engage the die.

13. The semiconductor package of claim 1 wherein the opposing portions of the side region of the die clip engage the die.

* * * * *